United States Patent
Ren et al.

(10) Patent No.: US 9,601,431 B2
(45) Date of Patent: Mar. 21, 2017

(54) DIELECTRIC/METAL BARRIER INTEGRATION TO PREVENT COPPER DIFFUSION

(71) Applicant: Applied Materials, Inc., Santa Clara, CA (US)

(72) Inventors: He Ren, San Jose, CA (US); Mehul B. Naik, San Jose, CA (US); Yong Cao, San Jose, CA (US); Mei-yee Shek, Palo Alto, CA (US); Yana Cheng, San Jose, CA (US); Sree Rangasai V. Kesapragada, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 357 days.

(21) Appl. No.: 14/173,807

(22) Filed: Feb. 5, 2014

(65) Prior Publication Data

US 2015/0221596 A1    Aug. 6, 2015

(51) Int. Cl.
| | | |
|---|---|---|
| *H01L 23/532* | (2006.01) | |
| *H01L 21/02* | (2006.01) | |
| *H01L 21/768* | (2006.01) | |
| *H01L 21/285* | (2006.01) | |

(52) U.S. Cl.
CPC .. *H01L 23/53238* (2013.01); *H01L 21/02178* (2013.01); *H01L 21/02266* (2013.01); *H01L 21/28556* (2013.01); *H01L 21/28562* (2013.01); *H01L 21/76834* (2013.01); *H01L 21/76849* (2013.01); *H01L 23/5329* (2013.01); *H01L 23/53295* (2013.01); *H01L 2924/0002* (2013.01)

(58) Field of Classification Search
CPC .............. H01L 23/53228–23/53238; H01L 23/5329–23/53295; H01L 21/02065; H01L 21/02074; H01L 21/76877; H01L 21/76883; H01L 21/76834; H01L 21/02178; H01L 21/7685
See application file for complete search history.

(56) References Cited

U.S. PATENT DOCUMENTS

| | | | | |
|---|---|---|---|---|
| 4,643,950 | A | * | 2/1987 | Ogura et al. .................. 428/446 |
| 5,679,982 | A | * | 10/1997 | Gardner ....................... 257/758 |
| 5,695,810 | A | * | 12/1997 | Dubin et al. .................. 438/643 |
| 6,495,452 | B1 | * | 12/2002 | Shih .............................. 438/643 |
| 7,829,460 | B2 | * | 11/2010 | Streck et al. .................. 438/653 |
| 8,278,216 | B1 | * | 10/2012 | Alers et al. .................... 438/681 |
| 2004/0096592 | A1 | | 5/2004 | Chebiam et al. |
| 2006/0273431 | A1 | * | 12/2006 | He ................... H01L 21/76834 257/632 |

(Continued)

OTHER PUBLICATIONS

International Search Report and Written Opinion for related application PCT/US2015/011714—dated Apr. 14, 2015.

*Primary Examiner* — Matthew Landau
*Assistant Examiner* — Grant Withers
(74) *Attorney, Agent, or Firm* — Patterson + Sheridan, LLP

(57) ABSTRACT

An interconnect structure for use in semiconductor devices and a method for fabricating the same is described. The method includes positioning a substrate in a vacuum processing chamber. The substrate has an exposed copper surface and an exposed low-k dielectric surface. A metal layer is formed over the copper surface but not over the low-k dielectric surface. A metal-based dielectric layer is formed over the metal layer and the low-k dielectric layer.

1 Claim, 3 Drawing Sheets

(56) References Cited

U.S. PATENT DOCUMENTS

| | | | |
|---|---|---|---|
| 2007/0042596 A1* | 2/2007 | McTeer | 438/622 |
| 2008/0026554 A1 | 1/2008 | Yang | |
| 2009/0269507 A1* | 10/2009 | Yu et al. | 427/535 |
| 2010/0248473 A1* | 9/2010 | Ishizaka et al. | 438/659 |
| 2011/0084393 A1 | 4/2011 | Cabral, Jr. et al. | |
| 2012/0149191 A1 | 6/2012 | Yang et al. | |
| 2012/0161320 A1* | 6/2012 | Akolkar et al. | 257/751 |
| 2013/0236657 A1* | 9/2013 | Anthis | 427/535 |
| 2013/0270703 A1* | 10/2013 | Zierath | H01L 21/76877 257/751 |
| 2015/0028483 A1* | 1/2015 | Zhou | 257/762 |
| 2015/0171007 A1* | 6/2015 | Huang | H01L 23/5226 257/774 |

* cited by examiner

DIELECTRIC/METAL BARRIER INTEGRATION TO PREVENT COPPER DIFFUSION

BACKGROUND

Field

Aspects of the present invention relate generally to interconnect structures for use in semiconductor devices and methods for forming such structures.

Description of the Related Art

Feature sizes of components on integrated circuits have been steadily decreasing for the last several decades. As feature sizes have decreased, computers have become more powerful and less expensive for consumers. In order for the decreasing trend to continue, the thickness of the dielectric barrier that surrounds the interconnects must also decrease. Interconnects connect the different components on an integrated circuit. A thinner dielectric barrier correlates to a lower dielectric constant for the dielectric barrier and a lower capacitance surrounding the interconnects (hereinafter, "interline capacitance"). Conventional interconnects are made of copper, which is selected because copper is highly conductive compared to other metals. However, copper diffuses into conventional dielectric barriers, eventually causing device failure. Regrettably, the diffusivity of copper becomes amplified as the thickness of the dielectric barrier decreases.

Therefore, what is needed in the art is an improved interconnect structure and methods for forming such structures.

SUMMARY

Embodiments of the present invention are directed to an interconnect structure and a method of fabricating the same. The method includes positioning a substrate within a vacuum processing chamber. The substrate has an exposed copper surface and an exposed low-k dielectric surface. A metal layer is deposited over the copper surface. For example, the metal layer may be selectively deposited over the copper surface. The metal layer may include a cobalt compound. A metal-based dielectric layer is deposited over the metal layer and over at least part of the dielectric surface. The metal-based dielectric layer may include an aluminum compound.

The interconnect structure includes a low-k dielectric layer. The low-k dielectric layer has a trench patterned therein. A copper layer at least partially fills the trench. A metal layer is formed over the copper layer and includes a cobalt compound. A metal-based dielectric layer is formed over the metal layer and the low-k dielectric layer. The metal-based dielectric layer may include an aluminum compound.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
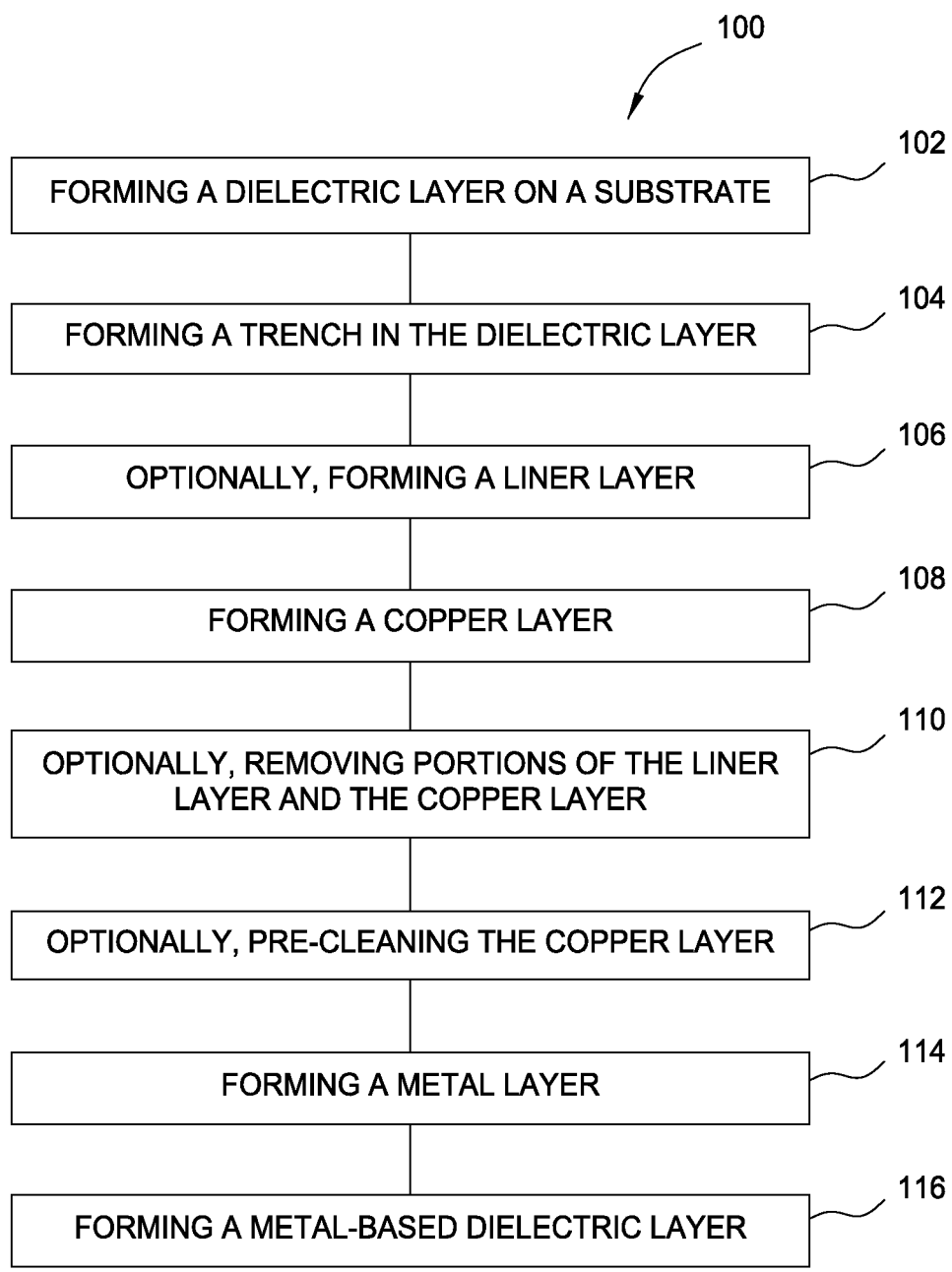
FIG. 1 is a process flow diagram of a process for forming an interconnect structure.

While the foregoing is directed to embodiments of the present invention, other and further embodiments of the invention may be devised without departing from the basic scope thereof, and the scope thereof is determined by the claims that follow.

As used herein, a vacuum processing system includes a tool within which a substrate may be processed in two or more vacuum processing chambers without breaking vacuum, i.e., without exposing the substrate to an ambient environment. A representative vacuum processing system is a cluster tool. As used herein, a vacuum processing chamber includes an etching chamber, a cleaning chamber, or a deposition chamber. The deposition chamber may be, for example, a chemical vapor deposition reactor (CVD), an atomic layer deposition reactor (ALD), a physical vapor deposition reactor (PVD), or other chambers suitable for depositing a dielectric layer, such as a low-k dielectric layer, a metal layer, and/or a metal oxide, metal nitride, or metal oxynitride layer. As used herein, a low-k dielectric material is a material having a dielectric constant less than that of silicon dioxide (or less than 4.0), and includes carbon doped silicon oxides and other suitable materials, for example, BLACK DIAMOND® low-k dielectric, available from Applied Materials, Inc., located in Santa Clara, Calif. As used herein, a "cobalt compound" includes metallic cobalt and compounds comprising cobalt and one other element, such as, for example, cobalt tungsten phosphide, cobalt tungsten nitride, or cobalt tungsten phosphonitride. As used herein, an "aluminum compound" includes compounds containing aluminum and at least one other element, such as, for example, aluminum oxide, aluminum nitride, and aluminum oxynitride. As used herein, "copper" includes metallic copper and alloys of copper. The term "precursor" is used to refer to any process gas which takes part in a reaction to either remove or deposit material from a surface.

By sequentially forming a metal layer and a metal-based dielectric layer above a copper layer, a thin integrated dielectric barrier having a reduced interline capacitance and a low diffusivity to copper may be fabricated. The metal layer may be deposited over an exposed copper surface of the interconnect structure but not over an exposed dielectric surface of the interconnect structure. The metal layer may be cobalt or other metal that has good adhesion to copper. By adhering well to copper, the metal layer is resistant to electromigration and aids in preventing copper diffusion. The metal-based dielectric layer may be comprised of an aluminum compound, such as aluminum oxide, aluminum nitride, and/or aluminum oxynitride. The metal-based dielectric layer provides device integrity, prevents copper diffusion, and serves as a dielectric barrier. The resistance to copper diffusivity of the integrated structure comprising a metal layer comprising a cobalt compound and a metal-based dielectric layer comprising an aluminum compound is surprising. The resistance to copper diffusion of the integrated structure is substantially higher than the sum of the resistance to diffusion of the metal layer and the metal-based dielectric layer combined.

FIG. 1 is a process flow diagram summarizing a process 100 for forming an interconnect structure having a plurality of layers. FIGS. 2A-2G are cross-sectional views of an interconnect structure at different stages of the process 100. At block 102, a dielectric layer 210 is formed on a substrate 200 in a vacuum processing chamber, such as in a vacuum processing chamber of a vacuum processing system. The substrate 200 provides a surface on which devices may be formed which are selectively connected utilizing the interconnect structure formed thereover. As such, the substrate may be a semiconductor material such as silicon, germanium, or a compound semiconductor, a dielectric material such as glass, ceramic, or plastic, or a conductive material such as aluminum or another metal. The dielectric layer 210 may be deposited to a thickness from about 200 Å to about 1000 Å. The dielectric layer 210 may be comprised of a low-k dielectric material.

Figure 2A:
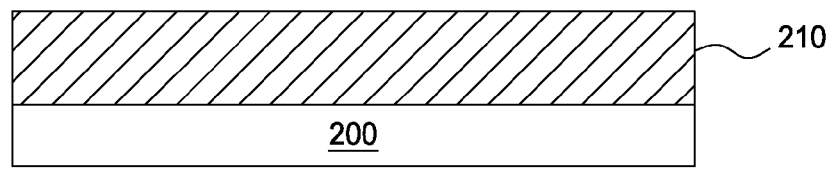
FIGS. 2A-2G illustrate an interconnect structure at different stages of the process of FIG. 1.
Figure 2B:
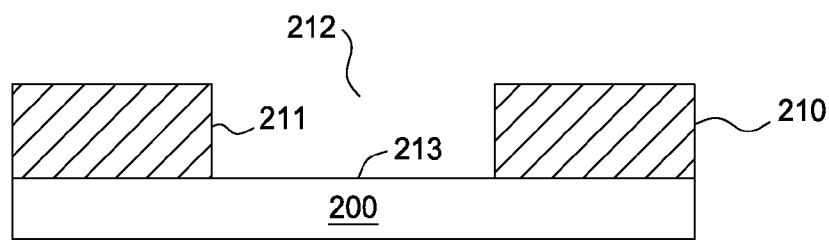

At block 104, a trench 212 is formed in the dielectric layer 210. The trench 212 may be formed, for example, by patterning a photoresist layer on the dielectric layer 210 and using a suitable etching process. The trench 212 may extend to the substrate 210 (as shown in FIG. 2B) or may stop short of the substrate 210. The trench 212 has sidewalls 211 and a floor 213. The sidewalls 211 may be perpendicular to the substrate 210 (as shown) or may be sloped.

Figure 2C:
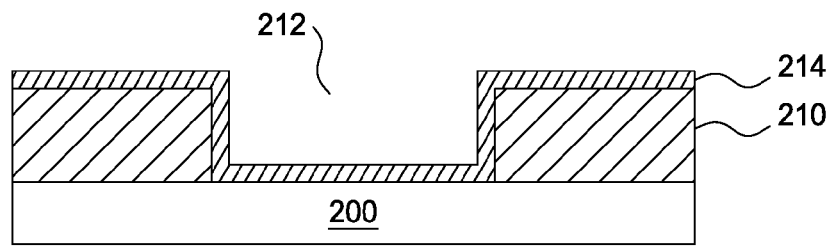

At optional block 106 and as shown in FIG. 2C, a liner layer 214 is formed over the sidewalls 211 and floor 213 of the trench 212. The liner layer 214 may serve as a barrier layer. The liner layer 214 may be formed conformally over the sidewalls 211 and floor 213. The liner layer 214 may be deposited to a thickness of, for example, about 10 Å to about 40 Å. The liner layer 214 may be, for example, tantalum, tantalum nitride, cobalt, ruthenium, or other suitable material.

Figure 2D:
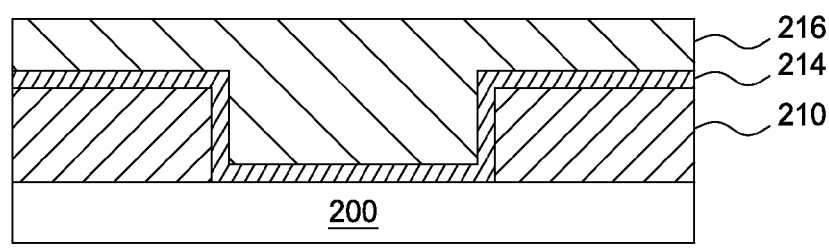

At block 108, a copper layer 216 is formed on the liner layer 214. The copper layer 216 at least partially fills the trench 212. The copper layer 216 may fill the trench 212 only in part, may fill the trench 212 completely, or and may fill the trench 212 completely and overlay a portion of the dielectric layer 210 (as shown in FIG. 2D). The copper layer 216 may be deposited by plating or other suitable techniques.

Figure 2E:
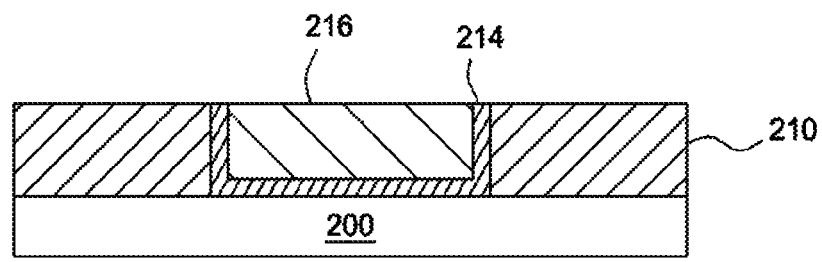

At optional block 110 and as shown in FIG. 2E, portions of the copper layer 216 and the liner layer 214 are removed to expose a surface of the dielectric layer 210, a surface of the liner layer 214, and a surface of the copper layer 216. Chemical mechanical polishing may be used to remove the portions of the copper layer 216, the liner layer 214, and the dielectric layer 210. After block 110, the upper surfaces of the dielectric layer 210, the liner layer 214, and the copper layer 216 may be substantially coplanar.

At optional block 112, the copper layer 216 may be pre-cleaned. The pre-cleaning process removes contaminants from the copper surfaces, such as copper oxides. Copper oxides may be chemically reduced by exposing the substrate 200 to a reducing agent. The pre-cleaning process may expose the substrate 200 to the reducing agent during a thermal process or a plasma process. The reducing agent may have a liquid state, a gas state, a plasma state, or combinations thereof. Reducing agents that are useful during the pre-cleaning process include, for example, hydrogen (e.g., $H_2$ or atomic-H), ammonia ($NH_3$), and a hydrogen and ammonia mixture ($H_2/NH_3$).

Figure 2F:
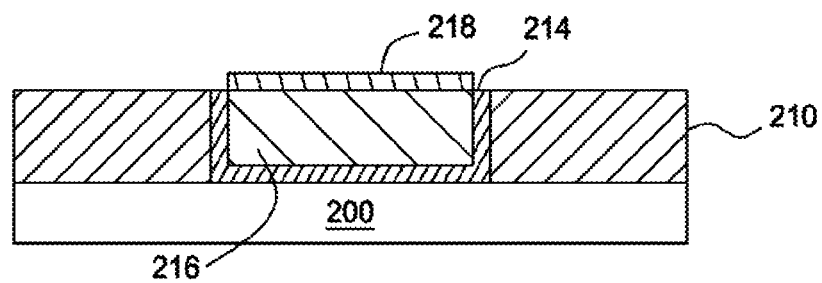

At block 114, a metal layer 218 is formed over the exposed surface of the copper layer 216. The metal layer 218 may be deposited such that the dielectric layer 210 is free or substantially free of the metal, as shown in FIG. 2F. Block 114 may be performed without breaking vacuum between block 112 and block 114. By preventing the substrate from being exposed to an ambient environment outside the vacuum processing system, the copper layer 216 may be formed completely or substantially free of oxidation. The metal layer 218 may be comprised of a cobalt compound or metallic aluminum. The cobalt compound may be, for example, cobalt (Co), cobalt tungsten phosphide (CoWP), cobalt tungsten nitride (CoWN), cobalt tungsten phosphonitride (CoWPN), or mixtures thereof. The metal layer 218 may have a thickness ranging from about 5 Å to about 100 Å, for example, from about 17 Å to about 50 Å, such as about 20 Å.

The metal layer 218 may be deposited using ALD, CVD, PVD, spin-on techniques, or other suitable techniques. ALD may be used in embodiments wherein the metal layer 218 is deposited on the copper layer 216 but not the dielectric layer 210 by exposing the substrate to precursors that react with the copper layer 216 but not with the dielectric layer 210. In embodiments wherein the metal layer 218 comprises cobalt, a cobalt-containing precursor may be introduced into the vacuum processing chamber. In embodiments wherein the metal layer 218 comprises cobalt and tungsten, a cobalt-containing precursor and a tungsten-containing precursor may be introduced into the vacuum processing chamber. Nitrogen and/or phosphorous may be introduced into the metal layer 218 by introducing into the vacuum processing chamber during processing a dopant containing nitrogen and/or phosphorus.

Representative processing conditions using a CVD or ALD deposition process include the following. The temperature may be between about 50° C. and about 300° C., such as between about 100° C. and 200° C. The pressure of the vacuum processing chamber may be maintained between about 100 mTorr and about 5 Torr, such as between about 1 Torr and about 2 Torr. The flow rates of the cobalt-containing precursors and any tungsten-containing precursors any dopants may range from about 50 sccm to about 5000 sccm, such as between about 500 sccm and about 2500 sccm.

Suitable cobalt-containing precursors include cobalt precursors, such as methylcyclopentadienyl cobalt bis(carbonyl) (MeCpCo(CO)$_2$), ethylcyclopentadienyl cobalt bis(carbonyl) (EtCpCo(CO)$_2$), dicobalt octa(carbonyl) (CO$_2$(CO)$_8$), and nitrosyl cobalt tris(carbonyl) ((ON)Co(CO)$_3$. Suitable cobalt-containing precursors also include cobalt carbonyl compounds or complexes, such as cyclopentadienyl cobalt bis(carbonyl) (CpCo(CO)$_2$), tricarbonyl allyl cobalt ((CO)$_3$Co(CH$_2$CH=CH$_2$)), dicobalt hexacarbonyl bytylacetylene (CCTBA, (CO)$_6$Co$_2$(HC≡CtBu)), dicobalt hexacarbonyl methylbytylacetylene ((CO)$_6$Co$_2$(MeC≡CtBu)), and dicobalt hexacarbonyl phenylacetylene ((CO)6Co2(HC≡CPh)). Suitable cobalt-containing precursors also include cobalt amidinates or cobalt amido complexes, such as bis(di(butyldimethylsilyl)amido) cobalt (((BuMe$_2$Si)$_2$N)$_2$Co), bis(di(ethyidimethylsilyl)amido) cobalt (((EtMe$_2$Si)$_2$N)$_2$Co), bis(di(propyidimethylsilyl)amido) cobalt (((PrMe$_2$Si)$_2$N)$_2$Co), and bis(di(trimethylsilyl)amido) cobalt (((Me$_3$Si)$_2$N)$_2$Co).

Suitable tungsten-containing precursors include W(CO)$_6$. Suitable tungsten-containing precursors also include tungsten halides (WX$_6$, where X is a halogen). Suitable nitrogen dopants include NF$_3$, NH$_3$, N$_2$, N$_2$H$_4$. Suitable phosphorous dopants include, for example, PH$_3$.

Figure 2G:
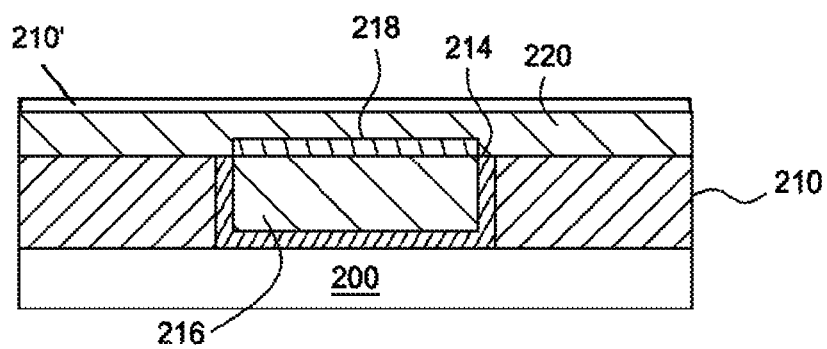

At block 116, a metal-based dielectric layer 220 is formed on top of the dielectric layer 210 and the metal layer 218. The metal-based dielectric layer 220 may be formed over at least part of the exposed surface of the dielectric layer 210, such as over the entire exposed surface of the dielectric layer 210 (as shown in FIG. 2G). The metal-based dielectric layer 220 may have a thickness of about 10 Å to about 100 Å, such as about 20 Å to about 40 Å. Block 116 may be performed without breaking vacuum between block 114 and block 116. By preventing the substrate 200 from being exposed to an ambient environment outside the vacuum processing system, the metal layer 218 may be completely or substantially free of oxidation. For example, if vacuum is broken, the surface 5-10 Å of a cobalt metal layer 218 may be CoO. If vacuum is not broken, the surface 5-10 Å of a cobal metal layer 218 may be pure cobalt.

The metal-based dielectric layer 220 may be comprised of aluminum oxide, aluminum nitride, aluminum oxynitride, and mixtures thereof. The metal-based dielectric layer 220 may be deposited using PVD. Representative PVD processing conditions include the following. The target may be aluminum oxide, aluminum nitride, aluminum oxynitride, or a mixture thereof. The temperature may be between about 100° C. and about 400° C., such as between about 150° C. and about 350° C., for example, 200° C. The pressure may be between about 3 mTorr and about 400 mTorr, such as between about 50 mTorr and 100 mTorr, such as 70 mTorr. An argon carrier plasma may used, and the source power may be between about 500 W to about 3000 W, such as between about 1000 W to about 2000 W, such as about 1500 W.

At optional block 118, if additional interconnects are required on the substrate 200, then a second dielectric layer 210' (not shown) may be formed on top of the metal-based dielectric layer 220, and the process of blocks 102, 104, 106, 108, 110, 112, 114, and 116 may be repeated. In one embodiment, a second dielectric layer 210' is formed directly above a metal-based dielectric layer 220. Any number of interconnects may be provided by repeating the process any desired number of times.

Working Examples

To deposit a cobalt metal layer 218 over the exposed surface of the copper layer 216, methylcyclopentadienyl cobalt bis(carbonyl) (MeCpCo(CO)$_2$) and NH$_3$ may be sequentially introduced into the vacuum processing chamber in an ALD-like process. Methylcyclopentadienyl cobalt bis(carbonyl) may be introduced along with an argon carrier gas into a vacuum processing chamber at a flow rate of 200 sccm while the processing chamber is maintained at 1.5 Torr. The chamber may then be evacuated and purged with argon. Ammonia may then be introduced along with an argon carrier gas at 300 sccm while the vacuum processing chamber is maintained at 120 mTorr. During the introduction of both the methylcyclopentadienyl cobalt bis(carbonyl) and the ammonia, the processing chamber may be maintained at 150° C.

To deposit an aluminum nitride metal-based dielectric layer 220 over the metal layer 218 and the dielectric layer 210 using a PVD process, the substrate may be positioned inside a vacuum processing chamber that is maintained at 5 m Torr and 200° C. An aluminum metal target may be used, and a N$_2$/Ar plasma may be generated from a source power of 1000 W source power.

The previously described embodiments have many advantages, including that embodiments of the disclosed dielectric barrier have a reduced interline capacitance, a lower copper diffusivity than conventional technology; and may be thinner than conventional technology. For example, at a 20 nm process node (N20), the dielectric barriers disclosed herein have demonstrated an approximately 5% reduction in interline capacitance compared to conventional dielectric barriers. Embodiments disclosed herein demonstrated an interline capacitance of approximately 160 pF, whereas conventional technology demonstrated an interline capacitance of approximately 152 pF. Such a dramatic reduction in interline capacitance is surprising because previous attempts at reducing interline capacitance struggle to reduce interline capacitance by even 2%. Additionally, dielectric barriers disclosed herein are thinner than conventional barriers while simultaneously demonstrating a low copper diffusivity. Embodiments disclosed herein can substantially prevent copper diffusivity at an overall thickness of 37 Å or less. For example, when a 17 Å metal layer comprising a cobalt compound and a 20 Å aluminum nitride layer are formed on top of a copper substrate, the activation energy for copper diffusion and the breakdown voltage of the dielectric barrier are substantially the same. Moreover, the line-to-line leakage is also comparable to a conventional SiN barrier with a thickness of 500 Å. The aforementioned advantages are illustrative and not limiting. It is not necessary for all embodiments of the invention to have all the advantages of the invention or fulfill all the purposes of the invention.

While the foregoing is directed to embodiments of the present invention, other and further embodiments of the invention may be devised without departing from the basic scope thereof, and the scope thereof is determined by the claims that follow.

What is claimed is:
1. A method for forming an interconnect structure, the method comprising:
   positioning a substrate in a vacuum processing chamber, wherein the substrate comprises a copper layer having an exposed surface and a low-k dielectric layer having an exposed surface;
   forming a metal layer over the exposed copper surface but not over the exposed dielectric surface, wherein the metal layer comprises cobalt, cobalt tungsten phosphide, cobalt tungsten nitride, or cobalt tungsten phosphonitride, wherein the metal layer has a thickness of about 17 Å to about 50 Å, and wherein the metal-based dielectric layer is formed by physical vapor deposition;
   forming a metal-based dielectric layer over the exposed dielectric surface and the metal layer, wherein:
      the metal-based dielectric layer comprises aluminum oxide, aluminum nitride, or aluminum oxynitride
      wherein the metal-based dielectric layer has a thickness of about 10 Å to about 100 Å; and
      wherein the metal layer and the metal-based dielectric layer are formed without an airbreak;
   forming a second low-k dielectric layer directly over the metal-based dielectric layer;
   forming a trench in the second low-k dielectric layer; and
   filling the trench at least partially with copper.

* * * * *

UNITED STATES PATENT AND TRADEMARK OFFICE
CERTIFICATE OF CORRECTION

PATENT NO.        : 9,601,431 B2                              Page 1 of 1
APPLICATION NO.   : 14/173807
DATED             : March 21, 2017
INVENTOR(S)       : He Ren et al.

It is certified that error appears in the above-identified patent and that said Letters Patent is hereby corrected as shown below:

In the Specification

In Column 3, Line 42, delete "or and" and insert -- and/or --, therefor.

In Column 4, Line 53, delete "bytylacetylene" and insert -- butylacetylene --, therefor.

In Column 4, Line 54, delete "methylbytylacetylene" and insert -- methylbutylacetylene --, therefor.

In Column 4, Line 59, delete "(ethyidimethylsilyl)" and insert -- (ethyldimethylsilyl) --, therefor.

In Column 4, Line 60, delete "(propyidimethylsilyl)" and insert -- (propyldimethylsilyl) --, therefor.

In Column 5, Line 15, delete "cobal" and insert -- cobalt --, therefor.

In Column 5, Line 28, delete "may used," and insert -- may be used, --, therefor.

Signed and Sealed this
Thirtieth Day of May, 2017

Michelle K. Lee
*Director of the United States Patent and Trademark Office*